United States Patent [19]
Chao

[11] Patent Number: 5,759,890
[45] Date of Patent: Jun. 2, 1998

[54] METHOD FOR FABRICATING A TREE-TYPE CAPACITOR STRUCTURE FOR A SEMICONDUCTOR MEMORY DEVICE

[75] Inventor: Fang-Ching Chao, Hsinchu, Taiwan

[73] Assignee: United Microelectronics Corporation, Taiwan

[21] Appl. No.: 751,442

[22] Filed: Nov. 18, 1996

[30] Foreign Application Priority Data

Aug. 16, 1996 [TW] Taiwan ............................ 85110003

[51] Int. Cl.[6] .................................................. H01L 21/8242
[52] U.S. Cl. ................................................ 438/253; 438/666
[58] Field of Search ................................. 438/253, 396, 438/637, 666, 672, 675, 739

[56] References Cited

U.S. PATENT DOCUMENTS

| | | |
|---|---|---|
| 5,071,783 | 12/1991 | Taguchi et al. |
| 5,077,688 | 12/1991 | Kumanoya et al. |
| 5,089,869 | 2/1992 | Matsuo et al. |
| 5,102,820 | 4/1992 | Chiba |
| 5,126,810 | 6/1992 | Gotou |
| 5,142,639 | 8/1992 | Kohyama et al. |
| 5,155,657 | 10/1992 | Oehrlein et al. |
| 5,158,905 | 10/1992 | Ahn |
| 5,164,337 | 11/1992 | Ogawa et al. |
| 5,172,201 | 12/1992 | Suizu |
| 5,196,365 | 3/1993 | Gotou |
| 5,206,787 | 4/1993 | Fujioka |
| 5,266,512 | 11/1993 | Kirsch |
| 5,274,258 | 12/1993 | Ahn |
| 5,338,955 | 8/1994 | Tamura et al. |
| 5,354,704 | 10/1994 | Yang et al. |

(List continued on next page.)

FOREIGN PATENT DOCUMENTS

| | | |
|---|---|---|
| 0 516 031 A1 | 12/1992 | European Pat. Off. |
| 5-21745 A | 1/1993 | Japan |
| 5-251657 | 9/1993 | Japan |
| 2 252 447 | 8/1992 | United Kingdom |

OTHER PUBLICATIONS

"Mini-Trenches in Polysilicon For Dram Storage Capacitance Enhancement", IBM Technical Disclosure Bulletin, vol. 33, No. 9, Feb. 1991.

Ema et al., "3-Dimensional Stacked Capacitor Cell for 16M and 64M DRAMS", International Electron Devices Meeting, pp. 592–595, Dec. 1988.

Wakamiya et al., "Novel Stacked Capacitor Cell for 64-Mb DRAM", 1989 Symposium on VLSI Technology Digest of Technical papers, pp. 69–70.

Primary Examiner—Chandra Chaudhari
Attorney, Agent, or Firm—Rabin, Champagne & Lynt, P.C.

[57] ABSTRACT

A method of fabricating a storage electrode of a storage capacitor of a semiconductor memory device, that includes a substrate, and a transfer transistor formed on the substrate. A first conductive layer is formed connected to the source/drain region. A first insulating layer is then formed over the first conductive layer. A first film is on a portion of the first insulating layer and a second film on the first film, wherein the first film and the second film form a stacked layer, the stacked layer having a sidewall. A second insulating layer is formed on the sidewall of the stacked layer. A third insulating layer is then over the substrate. The second insulating layer and a portion of the first insulating layer therebeneath are removed to form a first opening in the first insulating layer without exposing the first conductive layer. The fourth insulating layer is then removed and a second conductive layer is formed over the substrate and so as to substantially fill the first opening. The stacked layer and a portion of the second conductive layer thereon are then removed. A second opening is formed in the first and second conductive layers to expose a portion of the first insulating layer; and a third conductive layer is formed at a periphery of the opening, in connection with the peripheral edges of the first and second conductive layers, wherein the storage electrode includes the first, second and third conductive layers.

25 Claims, 14 Drawing Sheets

U.S. PATENT DOCUMENTS

| | | |
|---|---|---|
| 5,371,701 | 12/1994 | Lee et al. . |
| 5,389,568 | 2/1995 | Yun . |
| 5,399,518 | 3/1995 | Sim et al. . |
| 5,438,011 | 8/1995 | Blalock et al. . |
| 5,443,993 | 8/1995 | Park et al. . |
| 5,453,633 | 9/1995 | Yun . |
| 5,460,996 | 10/1995 | Ryou . |
| 5,478,768 | 12/1995 | Iwasa . |
| 5,478,770 | 12/1995 | Kim . |
| 5,482,886 | 1/1996 | Park et al. . |
| 5,508,222 | 4/1996 | Sakao . |
| 5,521,112 | 5/1996 | Tseng .................................... 438/253 |
| 5,521,419 | 5/1996 | Wakamiya et al. . |
| 5,523,542 | 6/1996 | Chen et al. . |
| 5,543,346 | 8/1996 | Keum et al. . |
| 5,550,076 | 8/1996 | Chen ...................................... 438/253 |
| 5,550,080 | 8/1996 | Kim . |
| 5,561,309 | 10/1996 | Cho et al. . |
| 5,561,310 | 10/1996 | Woo et al. . |
| 5,572,053 | 11/1996 | Ema . |
| 5,595,931 | 1/1997 | Kim . |

METHOD FOR FABRICATING A TREE-TYPE CAPACITOR STRUCTURE FOR A SEMICONDUCTOR MEMORY DEVICE

BACKGROUND OF THE INVENTION

1. Field of the Invention

The invention relates in general to semiconductor memory devices, and more particularly to a capacitor structure for a dynamic random access memory (DRAM) cell having a transfer transistor and a charge storage capacitor.

2. Description of the Related Art

FIG. 1 is a circuit diagram of a conventional memory cell for a DRAM device. As shown in the drawing, a DRAM cell is substantially composed of a transfer transistor T and a charge storage capacitor C. A source of the transfer transistor T is connected to a corresponding bit line BL, and a drain thereof is connected to a storage electrode 6 of the charge storage capacitor C. A gate of the transfer transistor T is connected to a corresponding word line WL. An opposing electrode 8 of the capacitor C is connected to a constant power source. A dielectric film 7 is provided between the storage electrode 6 and the opposing electrode 8.

In a conventional DRAM manufacturing process for a conventional DRAM having a storage capacity of less than 1 Mb (megabytes), a substantially two-dimensional capacitor called a planar type capacitor is mainly used. In the case of a DRAM having a memory cell using a planar type capacitor, electric charge is stored on electrodes disposed on the main surface of a semiconductor substrate, so that the main surface is required to have a relatively large area. This type of a memory cell is therefore not suitable for a DRAM having a high degree of integration. For a high level integration DRAM, such as a DRAM with more than 4 Mb of memory, a three-dimensional capacitor, called a stacked-type or a trench-type capacitor, has been introduced.

With stacked-type or trench-type capacitors, it has become possible to obtain a larger memory in a similar surface area. However, to realize a semiconductor device of an even higher degree of integration, such as a very-large-scale integration (VLSI) circuit having a capacity of 64 Mb, a capacitor of such a simple three-dimensional structure as the conventional stacked-type or trench-type, turns out to be insufficient.

One solution for improving the capacitance of a capacitor is to use the so-called fin-type stacked capacitor, which is proposed by Ema et al., in "3-Dimensional Stacked Capacitor Cell for 16M and 64M DRAMs", International Electron Devices Meeting, pp. 592–595, December, 1988. The fin-type stacked capacitor includes electrodes and dielectric films which extend in a fin shape in a plurality of stacked layers. DRAMs having the fin-type stacked capacitor are also disclosed in U.S. Pat. Nos. 5,071,783 (Taguchi et al.); U.S. Pat. No. 5,126,810 (Gotou); U.S. Pat. No. 5,196,365 (Gotou); and U.S. Pat. No. 5,206,787 (Fujioka).

Another solution for improving the capacitance of a capacitor is to use the so-called cylindrical-type stacked capacitor, which is proposed by Wakamiya et al., in "Novel Stacked Capacitor Cell for 64-Mb DRAM", 1989 Symposium on VLSI Technology, Digest of Technical Papers, pp. 69–70. The cylindrical-type stacked capacitor includes electrodes and dielectric films which extend in a cylindrical shape to increase the surface areas of the electrodes. A DRAM having the cylindrical-type stacked capacitor also is disclosed in U.S. Pat. No. 5,077,688 (Kumanoya et al.).

With the trend toward increased integration density, the size of the DRAM cell in a plane (the area it occupies in a plane) must be further reduced. Generally, a reduction in the size of the cell leads to a reduction in charge storage capacity (capacitance) of the conventional capacitors. Additionally, as the capacitance is reduced, the likelihood of soft errors arising from the incidence of α-rays is increased. Therefore, there is still a need in this art for a new design of a storage capacitor structure which can achieve the same capacitance, while occupying a smaller surface area in a plane, and a suitable method of fabricating the structure.

SUMMARY OF THE INVENTION

It is therefore an object of the invention to provide a method of fabricating a semiconductor memory device having a tree-type capacitor that allows an increased area for charge storage.

In accordance with the foregoing and other objects of the invention, there is provided a new and improved method of fabricating a semiconductor memory device having a substrate, and a transfer transistor, and a storage capacitor electrically connected to a source/drain region of the transfer transistor. The method includes forming a first insulating layer over the substrate and forming a first conductive layer over the first insulating layer and penetrating the first insulating layer to electrically connect to the source/drain region. A second insulating layer is formed over the first conductive layer, and a first and second films are piled on a portion of the second insulating layer to form a stacked layer. A third insulating layer is formed on a sidewall of the stacked layer. A fourth insulating layer is then formed over the substrate and the third insulating layer and a portion of the second insulating layer therebeneath are removed, without exposing the first conductive layer. The fourth insulating layer is then removed to form a first opening in the second insulating layer. A second conductive layer is then provided over the substrate which substantially fills the first opening. The stacked layer and a portion of the second conductive layer, on the stacked layer are then removed, and a fifth insulating layer is applied. A second opening which exposes a portion of the first insulating layer is formed in the first and second conductive layers. A third conductive layer is then formed at the periphery of the opening, so as to contact the peripheral edges of first and second conductive layers. In the resulting structure, the first and third conductive layers form a trunk-like conductive member, the second conductive layer form a branch-like conductive layer, and the trunk-like member and branch-like conductive layers form a storage electrode of the storage capacitor. Next, the second and fifth insulating layers are removed and a dielectric layer is applied to exposed surfaces of the first, second, and third conductive layers. A fourth conductive layer is then formed on the dielectric layer as an opposing electrode of the storage capacitor.

BRIEF DESCRIPTION OF THE DRAWINGS

Other objects, features, and advantages of the invention will become apparent from the following detailed description of the preferred but non-limiting embodiments, with reference to the accompanying drawings in which:

FIGS. 2A through 2I are cross-sectional views depicting a method of fabricating a semiconductor memory cell having a tree-type capacitor according to a first embodiment of the invention;

DESCRIPTION OF THE PREFERRED EMBODIMENTS

First Preferred Embodiment

Figure 1:
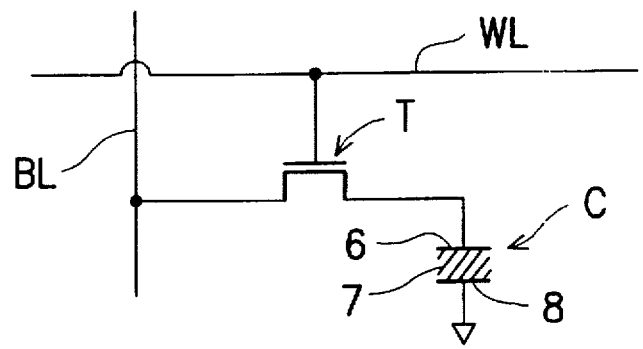
FIG. 1 is a circuit diagram of a conventional memory cell of a DRAM device.
Figure 2A:
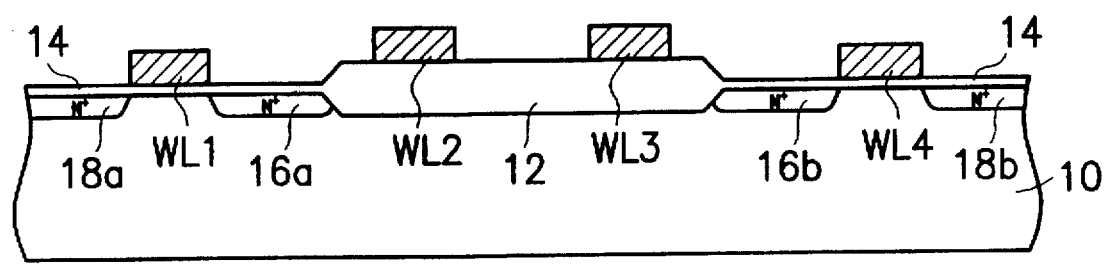

Referring to FIG. 2A, the surface of a silicon substrate 10 is first thermally oxidized, for example, using a local thermal oxidation of silicon (LOCOS) technique. Therefore, a field oxide layer 12 having a thickness of 3000 Å is formed which exposes an active region of the silicon substrate 10. The silicon substrate 10 is again thermally oxidized to form a gate oxide layer 14 having a thickness of, for example, 150 Å. Then, chemical vapor deposition (CVD) or low pressure chemical vapor deposition (LPCVD) is utilized to deposit a polysilicon layer having a thickness of, for example, about 2000 Å over the whole surface of the silicon substrate 10. Moreover, phosphorous ions may be implanted into the polysilicon layer to increase its conductivity. Preferably, a refractory metal layer is deposited and annealed to form a polycide layer (not shown) on the polysilicon layer so as to still further increase the conductivity. The refractory metal can be, for example, tungsten with a thickness of about 2000 Å. The polycide, and polysilicon layer are patterned, using a conventional photolithography and etching technique, to form gates (serving as word lines) WL1 through WL4, illustrated in FIG. 2A. Next, arsenic ions, at a dosage of about $1 \times 10^{15}$ atoms/cm$^2$ and an energy level of about 70 KeV, are implanted into the silicon substrate 10 to form drain regions 16a, 16b, and source regions 18a, 18b, using the word lines WL1 through WL4 as masks.

Figure 2B:
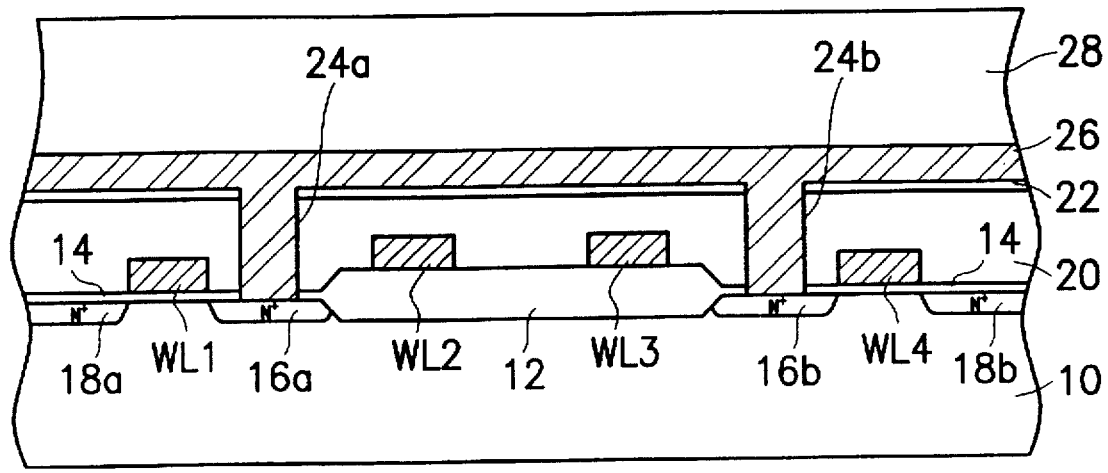

Referring to FIG. 2B, an insulating layer 20, for example, a layer of borophosphosilicate glass (BPSG) with a thickness of about 7000 Å, is deposited using CVD. Then, an etching protection layer 22, which is a silicon nitride layer with a thickness of, for example, about 1000 Å, is deposited by CVD. Then, the etching protection layer 22, the insulating layer 20, and the gate oxide layer 14 are etched in succession, using a conventional photoresist and etching technique so that storage electrode contact holes 24a, 24b are formed from the upper surface of the etching protection layer 22 to the surface of the drain regions 16a, 16b. A polysilicon layer 26 is formed using CVD to cover the surface of the etching protection layer 22 and completely fill the storage electrode contact holes 24a, 24b. Furthermore, arsenic ions can be implanted into the polysilicon layer 26 to increase its conductivity. After that, a thick silicon dioxide layer 28 with a thickness of, for example, about 7000 Å, is deposited on the surface of the polysilicon layer 26.

Figure 2C:
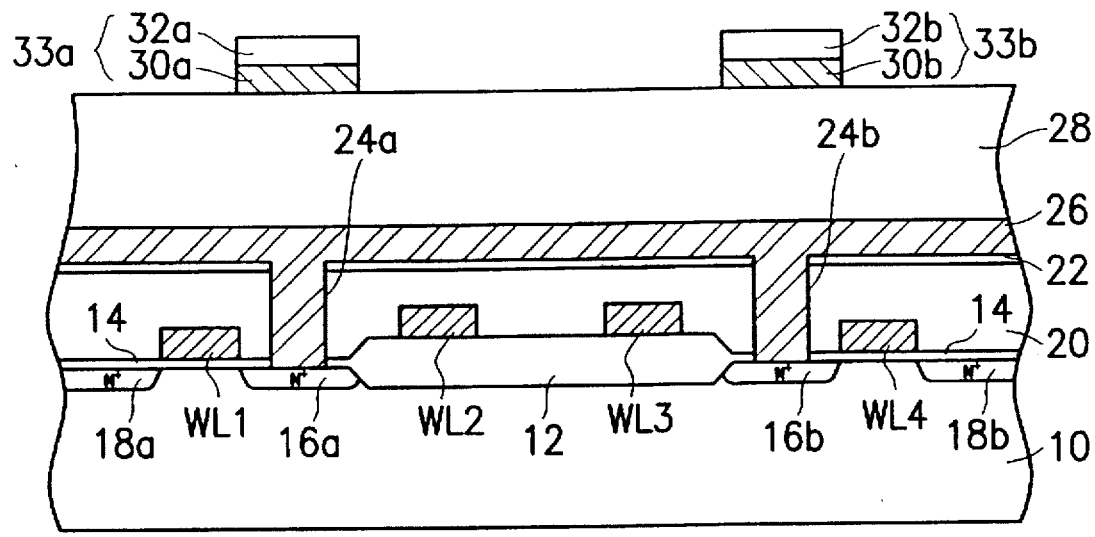

Referring to FIG. 2C, a silicon nitride layer and a sacrificial polysilicon layer are deposited in succession and patterned, using a conventional photolithography and etching technique, to form silicon nitride layers 30a, 30b and sacrificial polysilicon layers 32a, 32b substantially above the drain regions 16a, 16b. Each of the silicon nitride layers 30a, 30b may, for example, have a thickness of about 1000 Å, and the thickness of each of the sacrificial polysilicon layers 32a, 32b may have a thickness of, for example, about 1000 Å. The silicon nitride layer 30a, and the sacrificial polysilicon layer 32a together form a stacked layer 33 a aligned over the drain region 16a. On the other hand, the silicon nitride layer 30b and the sacrificial polysilicon layer 32b together form a stacked layer 33b aligned over the drain 16b. The stacked layers 33a and 33b are substantially solid and their horizontal cross sections can be circular or rectangular, for example, or any other suitable shape.

Figure 2D:
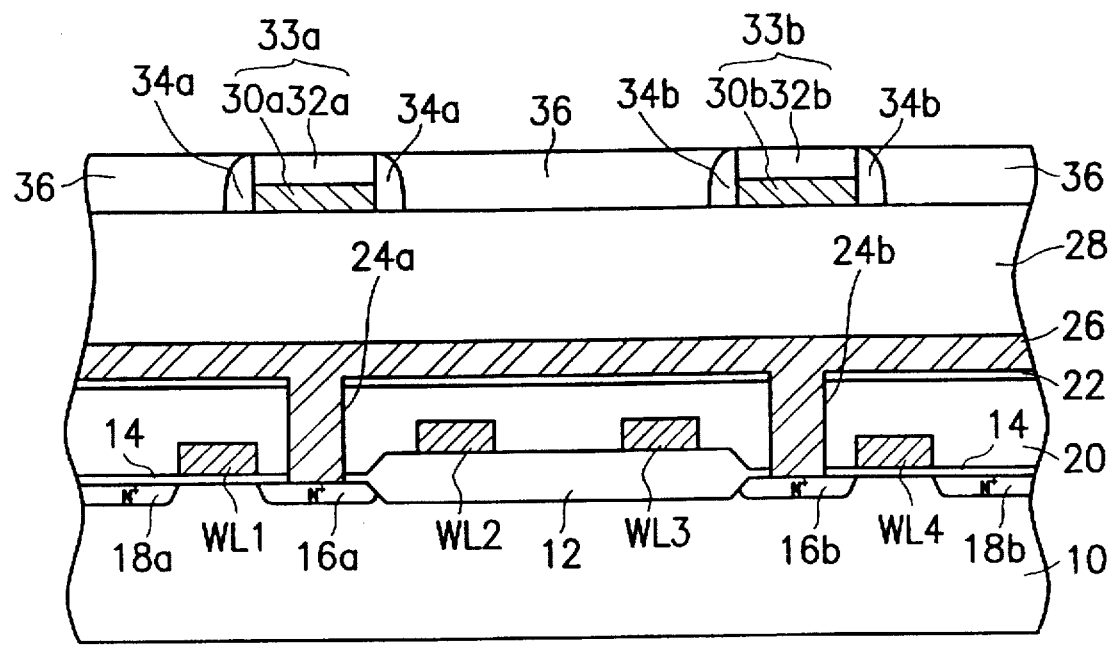

Referring to FIG. 2D, silicon dioxide spacers 34a and 34b are formed on the sidewalls of the stacked layers 33a and 33b, respectively. In accordance with the preferred embodiment of the invention, each of the spacers 34a, 34b can be formed by depositing a silicon dioxide layer with a thickness of about 1000 Å and etching back. A silicon nitride layer 36 with a thickness of, for example, about 2000 Å, is formed by CVD, and partially removed by a chemical mechanical polishing (CMP) technique, at least until the tops of the stacked layers 33a, 33b are exposed.

Figure 2E:
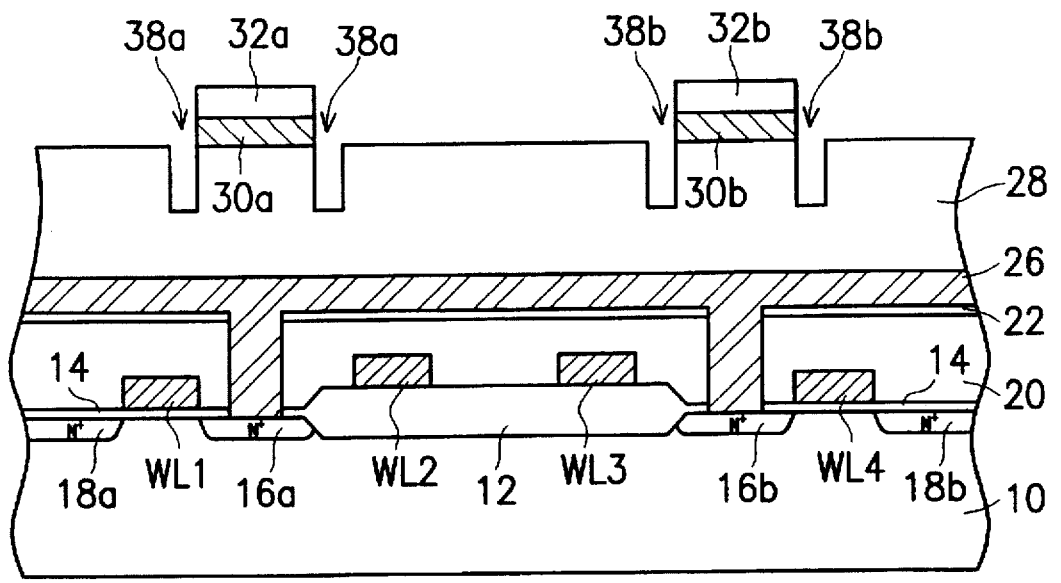

Referring to FIG. 2E, the silicon dioxide spacers 34a, 34b and a portion of the silicon dioxide layer 28 therebelow are removed by etching, using the stacked layers 33a, 33b and the silicon nitride layer 36 as masks, to form openings 38a, 38b whose bottom surfaces are above, and therefore do not contact, the upper surface of the polysilicon layer 26. The silicon nitride layer 36 is then removed by etching.

Figure 2F:
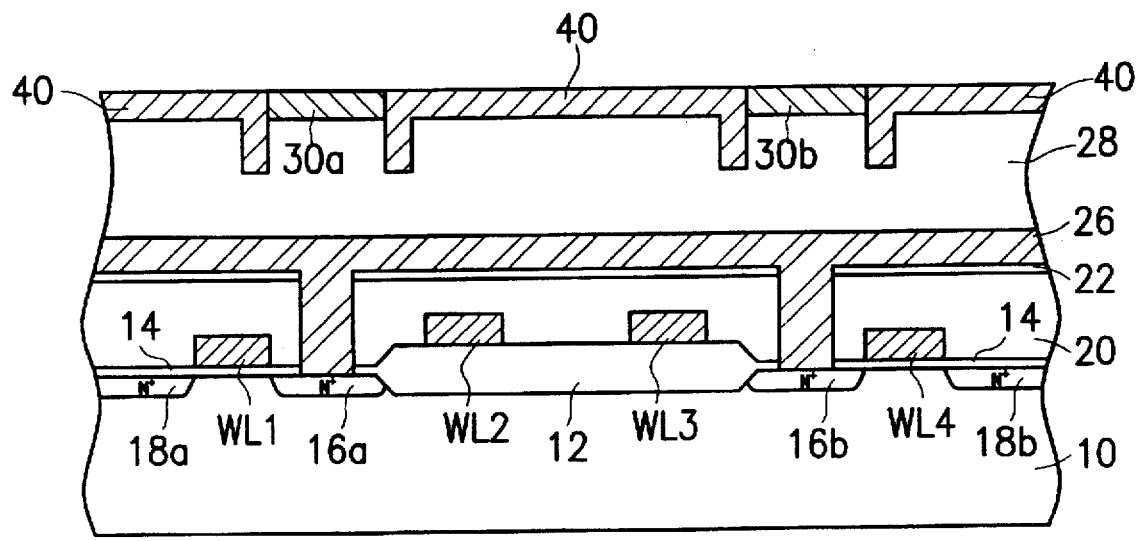

Referring to FIG. 2F, a polysilicon layer 40 having a thickness of, for example, about 1000 Å, is deposited on the surfaces of the stacked layers 33a, 33b, and the silicon dioxide layer 28 until the openings 38a, 38b are completely filled. Ions, such as arsenic ions, can be implanted into the polysilicon layer 40 to increase the latter's conductivity. Next, the polysilicon layer 40 is polished using CMP, until the sacrificial polysilicon layers 32a, 32b are removed, to thereby expose at least the tops of the silicon nitride layers 30a, 30b.

Figure 2G:
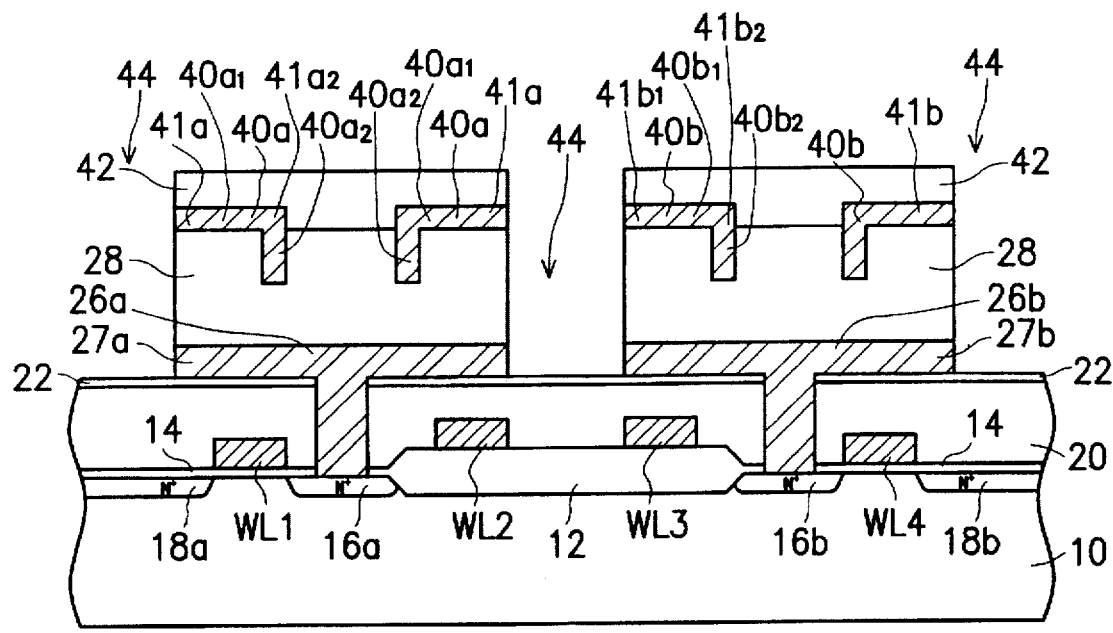

Referring to FIG. 2G, the silicon nitride layers 30a, 30b are removed, using a wet etching technique with the polysilicon layer 40 and the insulating layer 28 as masks. Then, a silicon dioxide insulating layer 42 having a thickness of, for example, about 2000 Å, is deposited by CVD. The insulating layer 42, the polysilicon layer 40, the silicon dioxide layer 28, and the polysilicon layer 26 are etched in succession, using a conventional photolithography and etching technique, so that an openings 44 are formed, on opposite sides of which the storage electrodes of respective memory cells are being formed. By the above-mentioned etching step, the polysilicon layers 40 and 26 are respectively segmented respectively into polysilicon layers 40a, 40b, that are L-shaped and branch-like in cross-section, and T-shaped trunk-like polysilicon layers 26a, 26b, respectively. The polysilicon layers 26a, 26b have respective outer edges 27a, 27b and are connected at bottoms thereof to the drain regions 16a, 16b. The polysilicon layer 40a has a horizontally extending portion 40a1 and a vertically extending portion 40a2. The polysilicon layer 40b likewise has a horizontally extending portion 40b1 and a vertically extending portion 40b2.

Figure 2H:
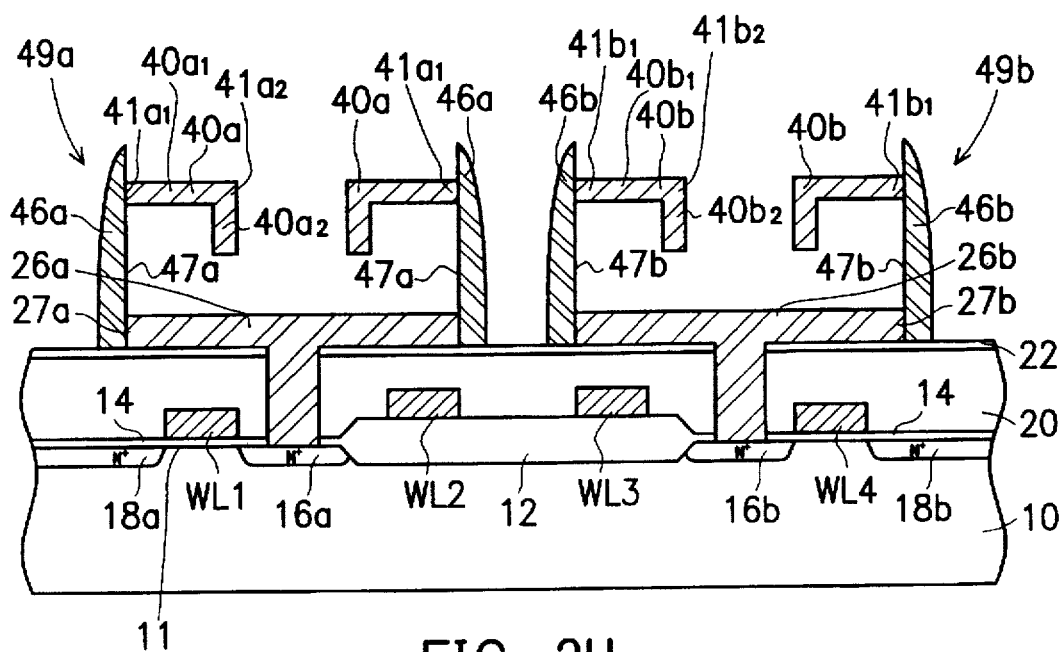
Figure 21:
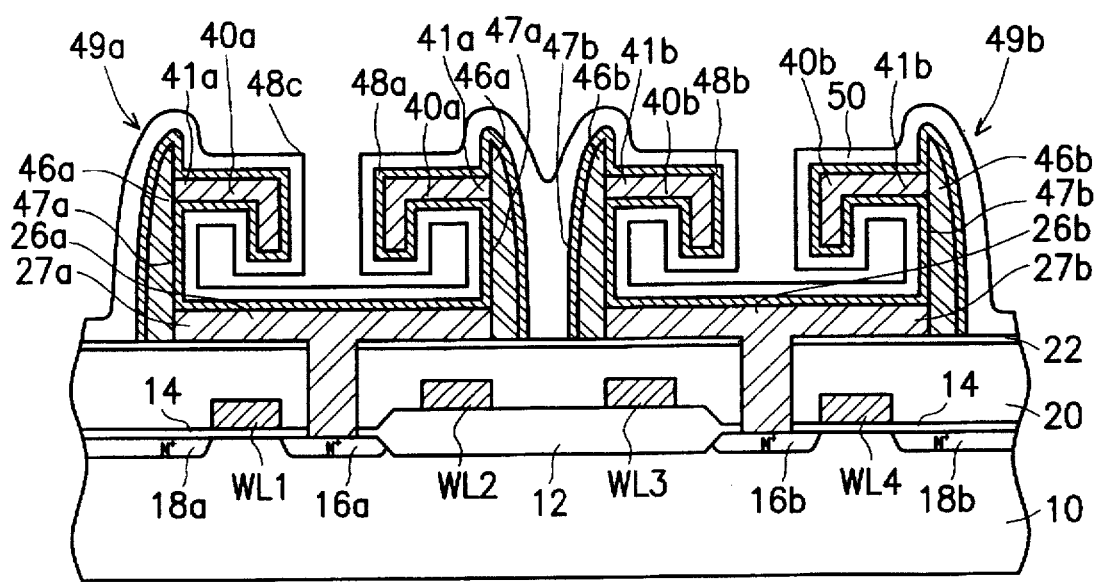

Referring to FIG. 2H, hollow, trunk-like polysilicon layers 46a, 46b are formed in the openings 44 by depositing a polysilicon layer with a thickness of, for example, about 10,000 Å over the substrate 10, and etching back. The polysilicon layers 46a and 46b have respective inner surfaces 47a and 47b, which directly contact the polysilicon layers 26a, 40a, and 26b, 40b, respectively. Arsenic ions can be implanted into the polysilicon layers 46a, 46b to increase their conductivity. Next, the silicon dioxide layers 42 and 28 are removed, using wet etching, with the etching protection layer 22 as an etch end point. By the above-mentioned wet etching step, storage electrodes of DRAM storage capacitors are completely formed wherein polysilicon layers 26a, 40a and 46a form a first storage electrode 49a, and the polysilicon layers 26b, 40b and 46b form a second storage electrode 49b. As shown in FIG. 2H, the two storage electrodes each includes a lower trunk-like polysilicon layer (26a or 26b), an upper trunk-like polysilicon layer (46a or 46b) and a branch-like polysilicon layer (40a or 40b). The branch-like polysilicon layers 40a, 40b are L-shaped in cross section and respectively include vertically extending portions 40a2, 40b2 that extend towards a top surface 11 of the substrate 10. The lower trunk-like polysilicon layers 26a, 26b have T-shaped cross sections and directly contact the drain regions 16a, 16b of the DRAM transfer transistors. The bottom ends of the upper trunk-like polysilicon layers 46a, 46b directly contact and extend substantially upwards from outer edges 27a, 27b of the lower trunk-like polysilicon layers 26a, 26b, respectively. An outer edge 41a1 of the horizontally extending portion 40a1 of the branch-like polysilicon layers 40a directly contacts the inner surface of the trunk-like upper polysilicon layers 46a. The horizontally extending portion 40a1 extends horizontally inwards to an inner end 41a2. Similarly, the horizontally extending portion 40b1 of the branch-like layer 40b has an outer edge 41b1 that directly contacts the inner surface of the trunk-like layer 46b and extends horizontally inward to an inner end 41b2 from which the vertically extending portion 40b2 extends downward. Because of their tree-like shapes, each storage electrode according to each preferred embodiment of the invention is termed a "tree-type storage electrode" and each storage capacitor is termed a "tree-type storage capacitor."

Referring to FIG. 2I, dielectric layers 48a, 48b are formed on the exposed surfaces of the storage electrodes 49a and 49b, respectively. The dielectric layers 48a, 48b can be, for example, silicon dioxide layers, silicon nitride layers or combinations of the two. Then, an opposing electrode 50 made of polysilicon is formed on the surfaces of each of the dielectric layers 48a, 48b. The opposing electrode 50 can be formed by the following steps: forming a polysilicon layer with a thickness of about 1000 Å by means of CVD, implanting N-type dopant into the polysilicon layer to increase its conductivity, and patterning the polysilicon layer by a conventional photolithography and etching technique.

Although not shown in FIG. 2I, it is well known to persons skilled in this art that further processes are necessary to form a DRAM IC. The further processes include fabricating bit lines, bonding pads, interconnections, passivation layers and packaging.

However, these processes are not related to the invention, and therefore, they are not further described herein.

In this preferred embodiment, the spacers 34a, 34b, and the layers 28 and 42 are made of silicon dioxide, and the layers 22, 30 and 36 are made of silicon nitride. However, silicon nitride can also be used to form the layers 28, and 42 and the spacers 34a, 34b, in which case the layers 22, 30, 36 are made of silicon dioxide. Moreover, any insulating material can be utilized to form the layers 28, and 42 and the spacers 34a, 34b, provided that the insulating material used to form the layers 22, 30, 36 has high etching selectivity to the other insulating material.

Second Preferred Embodiment

The storage electrode, in according to the first embodiment, has only one branch-like storage electrode layer, which is L-shaped in cross section. However, the invention is not limited to this particular embodiment. The number of branch-like storage electrode layers can be two, three, or more. In the second embodiment described below, the storage capacitor has two such L-shaped layers.

The DRAM storage electrode according to the second embodiment is fabricated based on the structure shown in FIG. 2F, and by further processes illustrated in FIGS. 3A to 3E. Elements in FIGS. 3A through 3E that are identical to those in FIG. 2C are labeled with the same reference numerals.

Figure 3A:
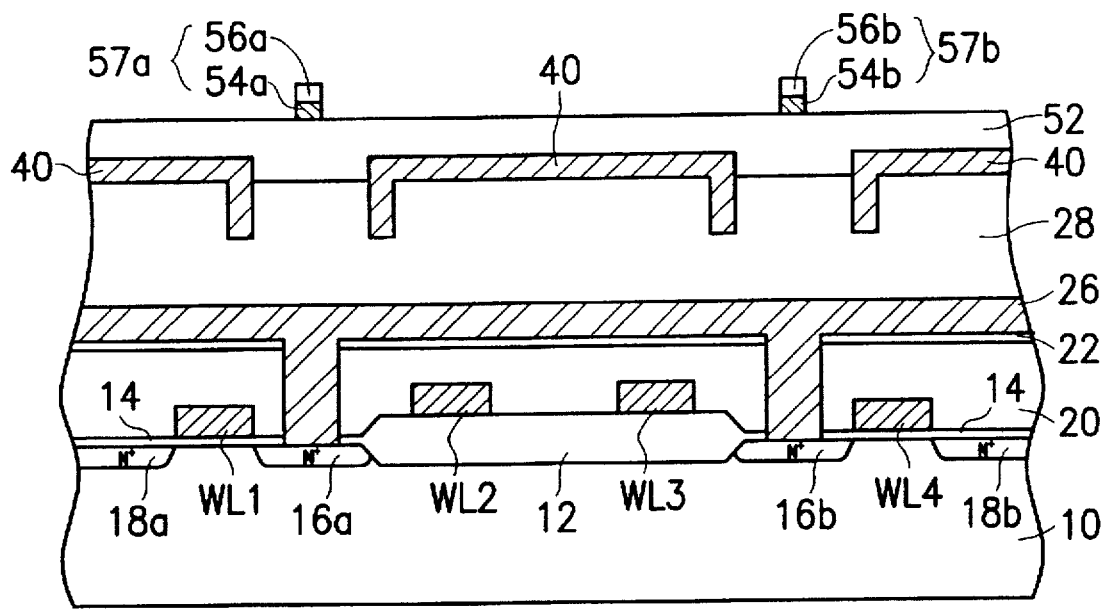
FIGS. 3A through 3F are cross-sectional views depicting a method of fabricating a semiconductor memory cell having a tree-type capacitor according to a second embodiment of the invention.

Referring to FIG. 2F and FIG. 3A, the silicon nitride layers 30a, 30b are removed, by wet etching, using the polysilicon layer 40 and silicon dioxide layer 28 as masks. A silicon dioxide layer 52 having a thickness of, for example, about 2000 Å, is deposited by CVD. Then, a silicon nitride layer and a sacrificial polysilicon layer are deposited in succession over the silicon dioxide layer 52, using CVD, and patterned as silicon nitride layers 54a, 54b and sacrificial polysilicon layers 56a, 56b, by conventional photolithography and etching techniques to be aligned above the drain regions 16a and 16b, as shown in FIG. 3A. Each of the silicon nitride layers 54a, 54b and the sacrificial polysilicon layers 56a, 56b has a thickness of, for example, 1000 Å. The silicon nitride layer 54a and the sacrificial polysilicon layer 56a together form a stacked layer 57a which is solid. Similarly, the silicon nitride layer 54b and the sacrificial polysilicon layer 56b together form a stacked layer 57b which is solid. The horizontal cross section of each of the stacked layers 57a, 57b can be circular or rectangular, for example, or any other suitable shape. The stacked layers 57a, 57b are located above the drain regions 16a, 16b, respectively. Moreover, each of the stacked layers 57a, 57b has a smaller width than the respective width of the previously described stacked layers 33a, 33b shown in FIG. 2C.

Figure 3B:
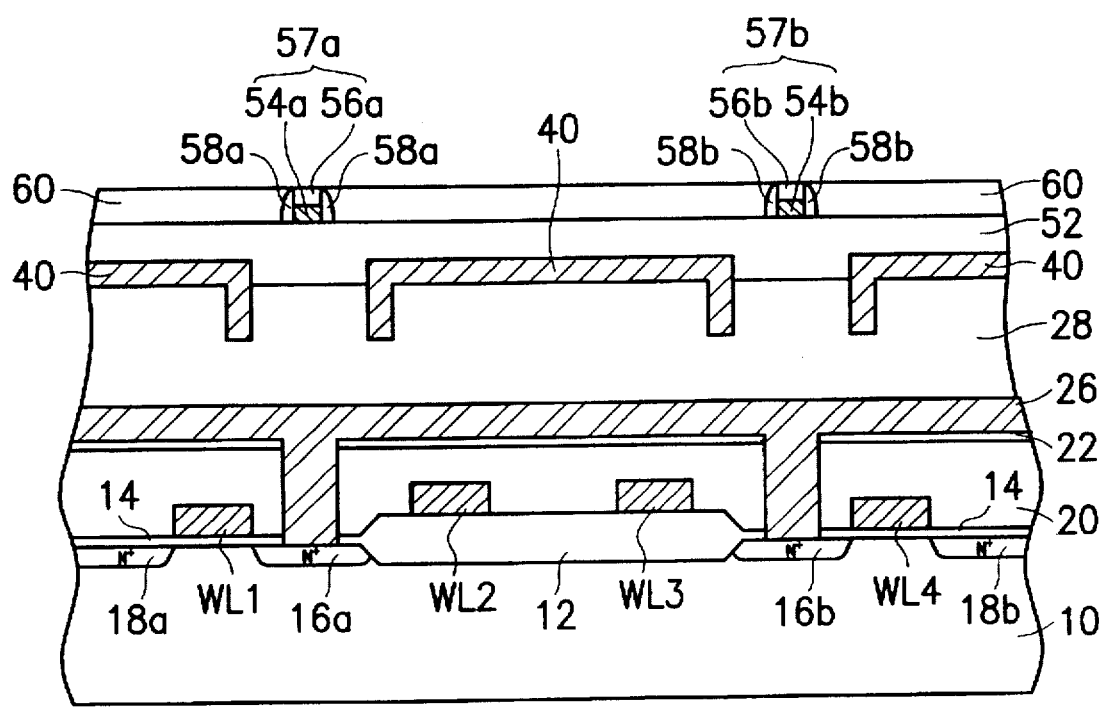

Referring to FIG. 3B, silicon oxide spacers 58a, 58b are formed on the side walls of the stacked layers 57a, 57b, by depositing a silicon dioxide layer with a thickness of about 1000 Å and etching back. Thereafter, a silicon nitride layer 60 with a thickness of, for example, 2000 Å, is deposited by CVD and then polished by a CMP technique until at least the tops of the stacked layers 57a, 57b are exposed.

Figure 3C:
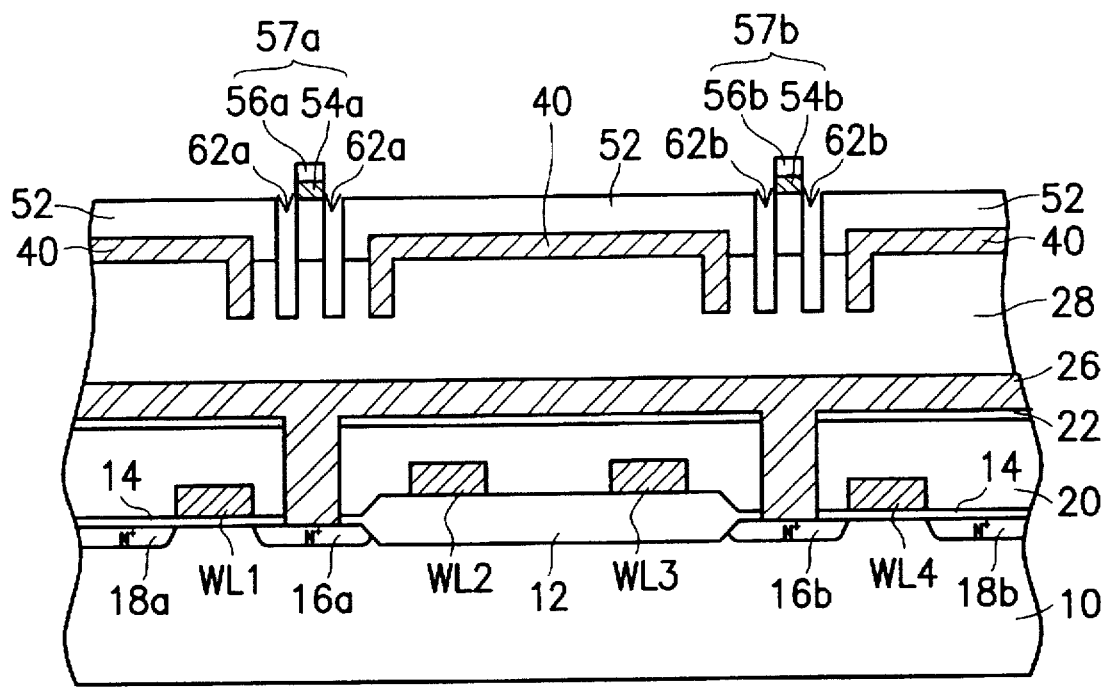

Referring to FIG. 3C, the spacers 58a, 58b, together with the silicon dioxide layers 52 and 28 beneath the spacers 58a, 58b, are removed by etching, using the stacked layers 57a, 57b and the silicon dioxide layer 60 as masks. The silicon nitride layer 60 is removed by etching, using the sacrificial polysilicon layers 56a, 56b as masks, so as to form openings 62a, 62b, wherein the openings 62a, 62b extend into the silicon dioxide layers 52 and 28 but do not reach the polysilicon layer 26 nor touch polysilicon layers 40a, 40b.

Figure 3D:
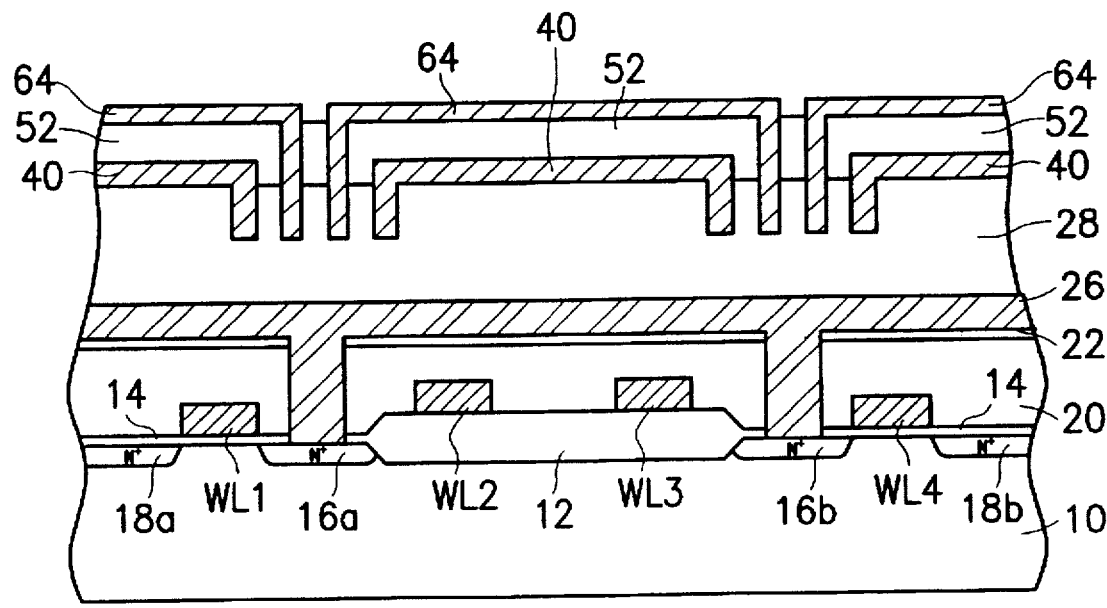

Referring to FIG. 3D, a polysilicon layer 64 having a thickness of, for example, 1000 Å, is deposited on the surfaces of the stacked layers 57a, 57b and the insulating layer 52, fills the openings 62a, 62b. Arsenic ions can be implanted in the polysilicon layer 64 to increase its conductivity. Thereafter, the polysilicon layer 64 and the sacrificial polysilicon layers 56a, 56b are polished, using a CMP technique, until the tops of the silicon nitride layers 54a, 54b are exposed, so that the sacrificial polysilicon layers 56a, 56b are removed. The silicon nitride layers 54a, 54b are then removed by wet etching, using the polysilicon layer 64 and the oxide layer 52 as masks.

Figure 3E:
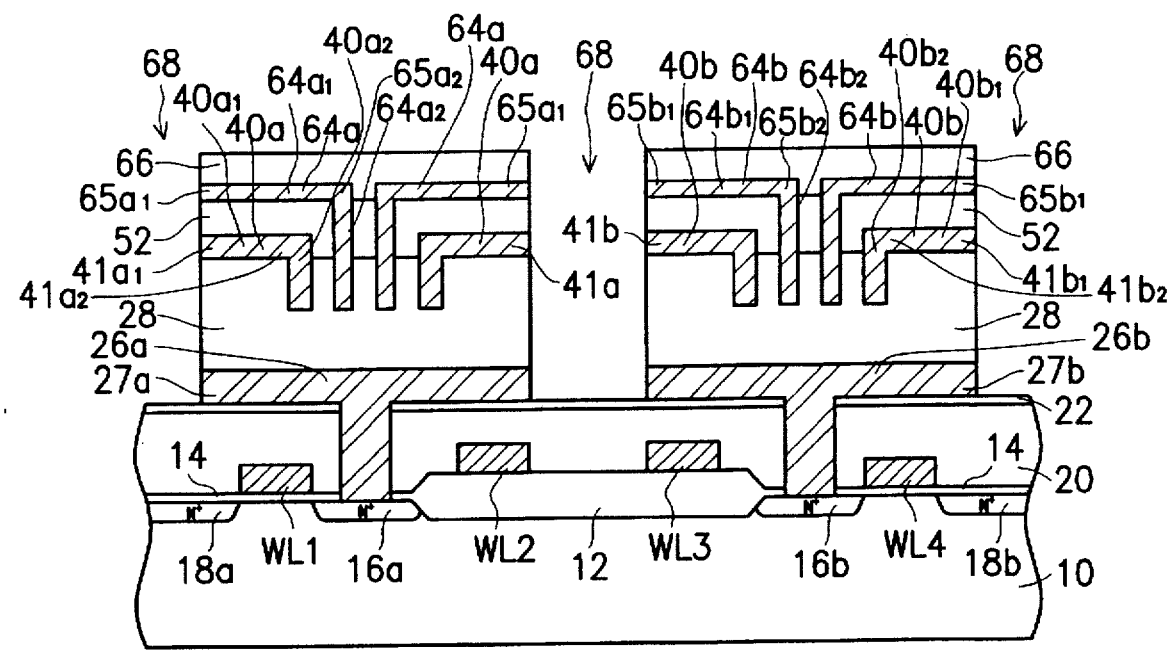

Referring to FIG. 3E, a silicon dioxide layer 66 having a thickness of, for example, 2000 Å, is deposited by CVD. The silicon dioxide layer 66, the polysilicon layer 64, the silicon dioxide layer 52, the polysilicon layer 40, the silicon dioxide layer 28, and the polysilicon layer 26 are etched in succession, using a conventional photolithography and etching technique, so as to form an opening 68. The opening 68 segments the polysilicon layers 64, 40, and 26 respectively into polysilicon layers 64a, 64b, 40a and 40b that appear L-shaped and branch-like in cross section, and T-shaped trunk-like polysilicon layers 26a, 26b, respectively. The polysilicon layers 26a, 26b have respective outer edges 27a, 27b. The polysilicon layers 64a and 64b, have respective horizontally extending portions 64a1 and, 64b1, and respective vertically extending portions 64a2, 64b2. Similarly, the polysilicon layers 40a and 40b have respective horizontally extending portions 40a1 and 40b1, and respective vertically extending portions 40a2 and 40b2.

Figure 3F:
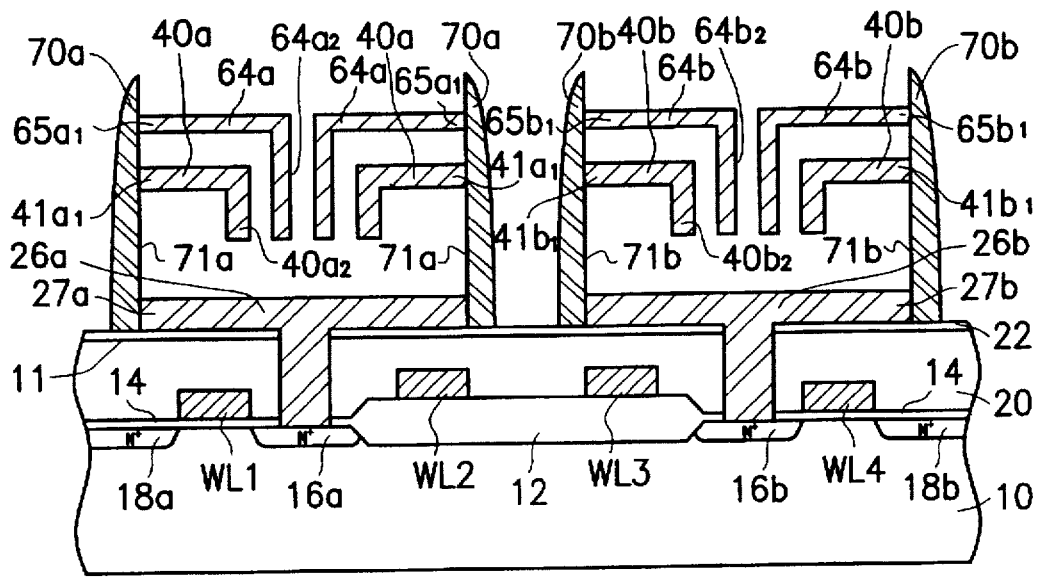

Referring to FIG. 3F, hollow, trunk-like polysilicon layers 70a, 70b are formed in the openings 68, for example, by depositing a polysilicon layer with a thickness of about 10,000 Å and etching back. Arsenic ions can be implanted the polysilicon layers 70a, 70b to increase their conductivity. The polysilicon layer 70a has an inner surface 71a, which contacts outer edges 27a, 41a1 and 65a1 of the polysilicon layers 26a, 40a and 64a respectively. Similarly, the polysilicon layer 70b has an inner surface 71b which contacts outer edges 27b, 41b1 and 65b1 of the polysilicon layers 26b, 40b and 64b, respectively. The exposed silicon dioxide layers 66, 52, and 28 are removed by wet etching, using the etching protection layer 22 as an etch end point, to complete the storage electrodes of the storage capacitors for the DRAM.

Each storage electrode illustrated includes a respective one of the two lower trunk-like polysilicon layers 26a, 26b, a respective one of the two upper trunk-like polysilicon layers 70a, 70b, and respective ones of the two branch-like polysilicon layers 64a, 64b and 40a, 40b. The trunk-like lower polysilicon layers 26a, 26b directly contact the respective drain regions 16a, 16b of the DRAM, and have substantially T-shaped cross sections. The trunk-like upper polysilicon layers 70a, 70b have bottom ends that directly contact the outer edges 27a, 27b of the trunk-like lower polysilicon layers 26a, 26b, respectively, and extend upwards in a substantially vertical direction. The branch-like polysilicon layers 64a, 64b are substantially parallel in their horizontal and vertical portions to the branch-like polysilicon layers 40a, 40b. The outer edges of the branch-like polysilicon layers 64a, 64b, and 40a, 40b directly contact the inner surfaces of the trunk-like upper polysilicon layers 70a, 70b and extend inward in a substantially horizontal direction to an inner end from which the layers further extend downward toward a top surface 11 of the substrate 10.

Further processes to form a DRAM IC are not related to the invention, and they therefore are not described herein.

In this preferred embodiment, the spacers 58a, 58b and the layers 28, 52 and 60 are made of silicon dioxide, and the layers 22 and 54 are made of silicon nitride. However, alternatively silicon nitride can also be used to form the spacers 58a, 58b and the layers 28, 52 and 60, in which case the layers 22 and 54 are made of silicon dioxide. Moreover, any insulating material can be utilized to form the spacers 58a, 58b and the layers 28, 52, and 60, provided that the insulating material used to form the layers 22 and 54 has high etching selectivity relative to the other insulating material.

In a modification of the second embodiment, the stacked layers are formed repeatedly. That is, after performing the steps illustrated in FIGS. 3A to 3D as described above, the same steps are repeated again at least once to form one or more additional branch-like conductive layers in each storage electrode.

Third Preferred Embodiment

The storage capacitor fabricated in accordance with either the first or the second embodiment has a branch-like storage electrode layer which contacts a hollow trunk-like layer all along its inner periphery and is L-shaped in all radial cross sections. However, the invention is not so limited. The invention also includes a storage capacitor having a branch-like storage electrode layer which contacts the hollow trunk-like layer along only part of its periphery.

Moreover, the trunk-like lower polysilicon layers manufactured in accordance with the first and second preferred embodiments as described are solid and T-shaped in cross section. However, the invention is not so limited, but may further include a storage electrode having a hollow trunk-like lower polysilicon layer. In this way, the surface area of the storage electrode is further increased without requiring additional substrate surface area. Such a trunk-like lower polysilicon layer may, for example have a U-shaped cross-section, as is described below.

The storage capacitor of the third embodiment is based on the wafer structure of FIG. 2A. Elements in FIG. 4A through 4E that are identical to those in FIG. 2A are labeled with the same reference numerals.

Figure 4A:
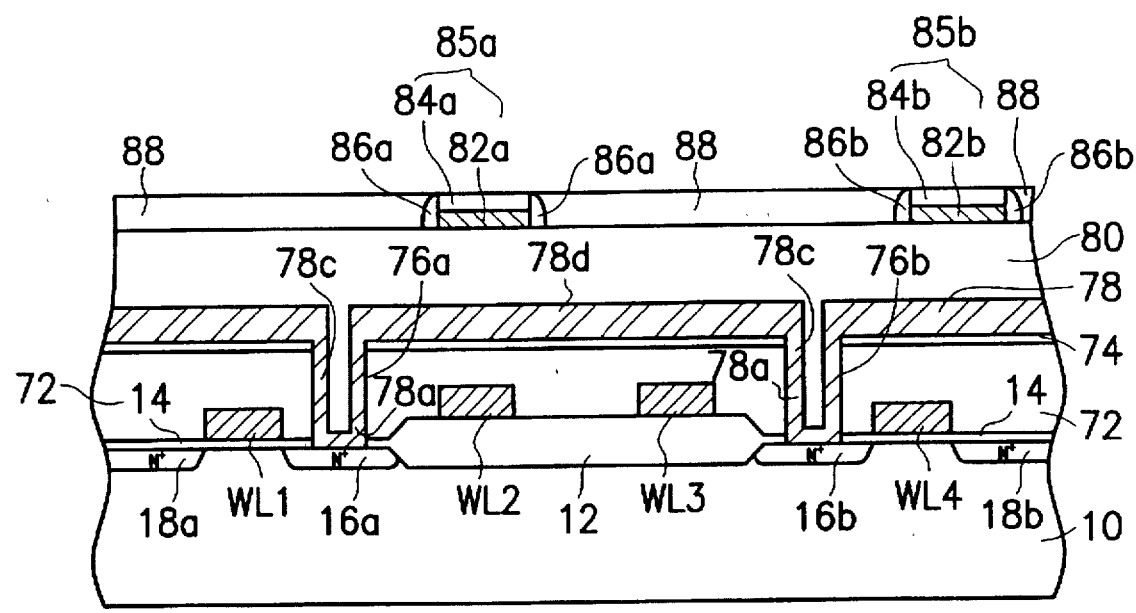
FIGS. 4A through 4E are cross-sectional views depicting a method of fabricating a semiconductor memory cell having a tree-type capacitor according to a third embodiment of the invention.

Referring to FIG. 2A and FIG. 4A, an insulating layer 72, such as BPSG with a thickness of about 7000 Å, is deposited by CVD for planarization. An etching protection layer 74, including silicon nitride with a thickness of, for example, about 1000 Å, is then deposited by CVD. The etching protection layer 74, the insulating layer 72, and the gate oxide layer 14 are etched in succession to form electrode contact holes 76a, 76b which expose the respective drain regions 16a, 16b. Next, a polysilicon layer 78 is deposited to cover the etching protection layer 74 and the periphery of the storage electrode contact holes 76a, 76b but not so as to completely fill these holes 76a, 76b. Therefore, the polysilicon layer 78 has base portion which is a hollow structure 78c having a U-shaped cross section and a planar support portion 78d. Ions, such as arsenic ions, can be implanted into the polysilicon layer 78 to increase its conductivity. A thick insulating layer 80 made of silicon dioxide, for example, with a thickness of about 7000 Å, is deposited on the polysilicon layer 78. Silicon nitride and then polysilicon are deposited, and patterned, using a conventional photolithography and etching technique, to form silicon nitride layers 82a, 82b and sacrificial polysilicon layers 84a, 84b, as shown in FIG. 4A. Each of the silicon nitride layers 82a, 82b, and sacrificial polysilicon layers 84a, 84b has a thickness of, for example, about 1000 Å. The silicon nitride layer 82a and the sacrificial polysilicon layer 84a together form a stacked layer 85a. The silicon nitride layer 82b and the sacrificial polysilicon layer 84b together form a stacked layer 85b. The stacked layers 85a, 85b are solid and their horizontal cross sections can be circular or rectangular, for example, or any other shape. The stacked layers 85a, 85b are preferably offset from the respective vertical axes of the drain regions 16a, 16b, and both of the stacked layers 85a, 85b are at the same side (right side or left side in FIG. 4A) of the respective vertical axis of the drain regions 16a, 16b. Silicon oxide spacers 86a, 86b are respectively formed on the sidewalls of the stacked layers 85a, 85b, by depositing a silicon dioxide layer with a thickness of about 1000 Å and etching back. A silicon nitride layer 88 having a thickness of about 2000 Å is deposited by CVD. Next, the silicon nitride layer 88 is polished, using a CMP technique, until the tops of the stacked layers 85a, 85b are exposed.

Figure 4B:
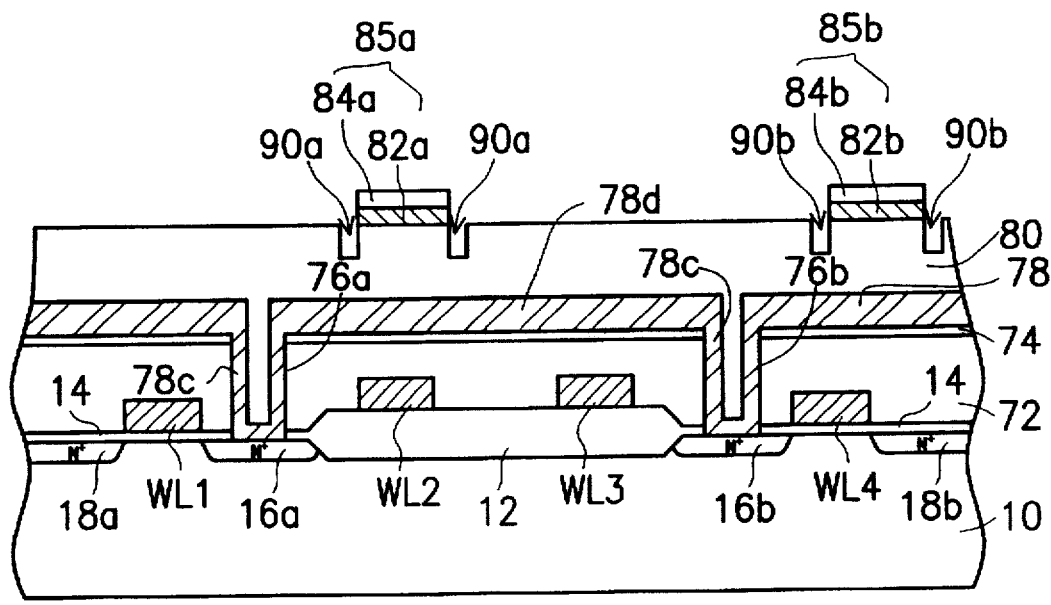

Referring to FIG. 4B, the silicon dioxide spacers 86a, 86b and a portion of the insulating layer 80 beneath the spacers 86a, 86b are removed by etching, using the stacked layers 85a, 85b and the silicon nitride layer 88 as masks, to form openings 90a, 90b in the silicon dioxide layer 80. Next, the insulating layer 88 is removed by etching, using the sacrificial polysilicon layers 84a, 84b as masks. The depth of each of the openings 90a, 90b can be adjusted according to individual requirements, to a level that does not reach the polysilicon layer 78.

Figure 4C:
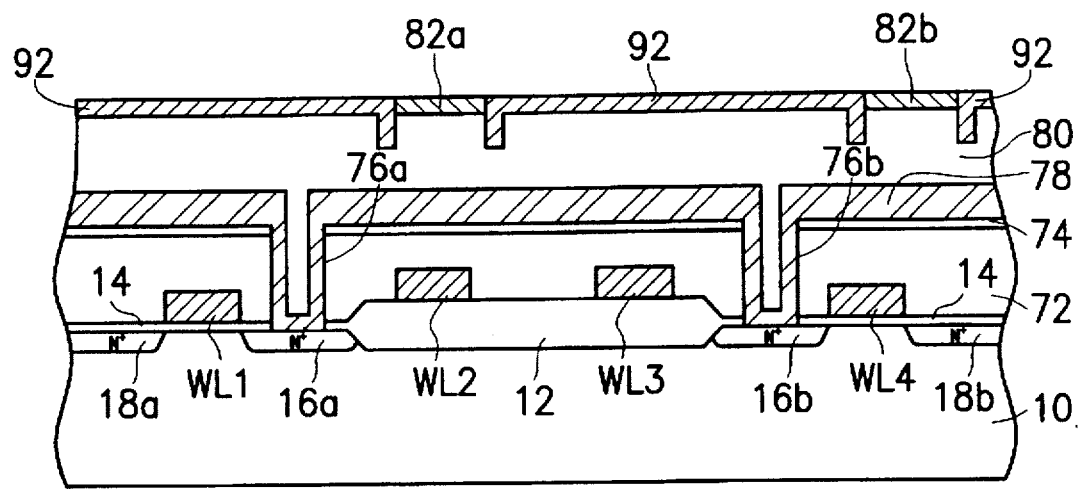

Referring to FIG. 4C, a polysilicon layer 92, with a thickness of about 1000 Å, is deposited on the stacked layers 85a, 85b and the insulating layer 80, to substantially completely fill the openings 90a, 90b. Ions, such as arsenic ions, can be implanted in the polysilicon layer 92 to increase its conductivity. Next, the polysilicon layer 92 is polished by a CMP technique until the tops of silicon nitride layers 82a, 82b are exposed. Accordingly, the polysilicon layers 84a, 84b are removed.

Figure 4D:
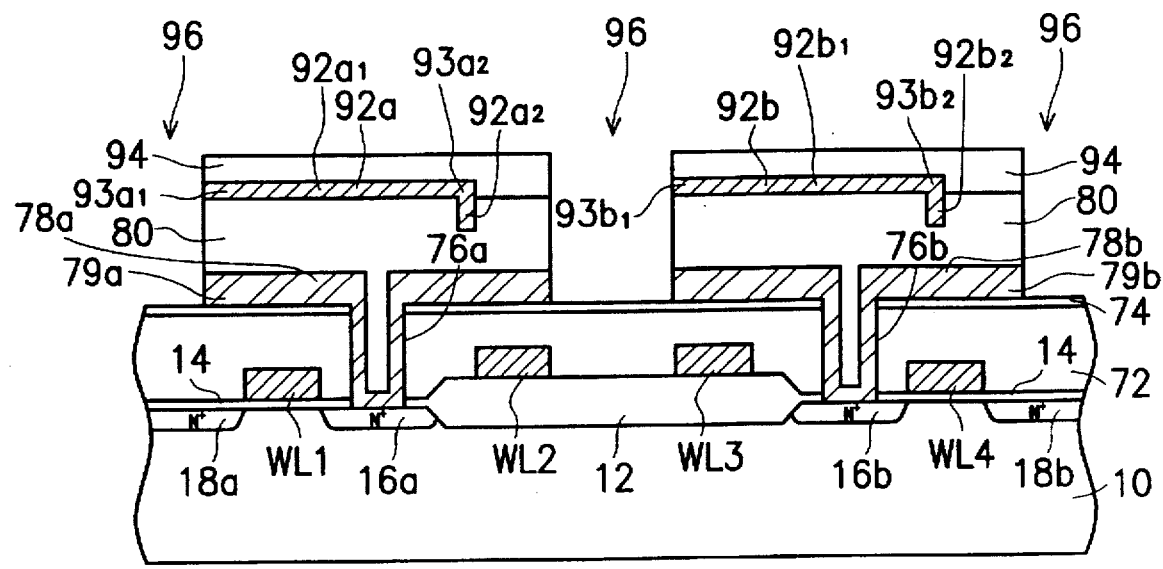

Referring to FIG. 4D, the silicon nitride layer 82a, 82b are removed by wet etching, using the polysilicon layer 92 and the silicon dioxide layer 80 as masks. A silicon dioxide layer 94, having a thickness of about 2000 Å, is deposited by CVD. The silicon dioxide layer 94, the polysilicon layer 92, the silicon dioxide layer 80 and the polysilicon layer 78 are etched in succession to form an opening 96 which exposes a portion of the etching protection layer 74, using a conventional photolithography and etching technique. Accordingly, the polysilicon layers 92 and 78 are respectively segmented into branch-like layers 92a, 92b, and lower trunk-like layers 78a, 78b. As shown in the figure, layers 92a and 92b have horizontal and vertical portions so as to be L-shaped in cross section. The polysilicon layers 78a, 78b have respective outer edges 79a, 79b, and are connected at their lower ends to the respective drain regions 16a, 16b, respectively.

Figure 4E:
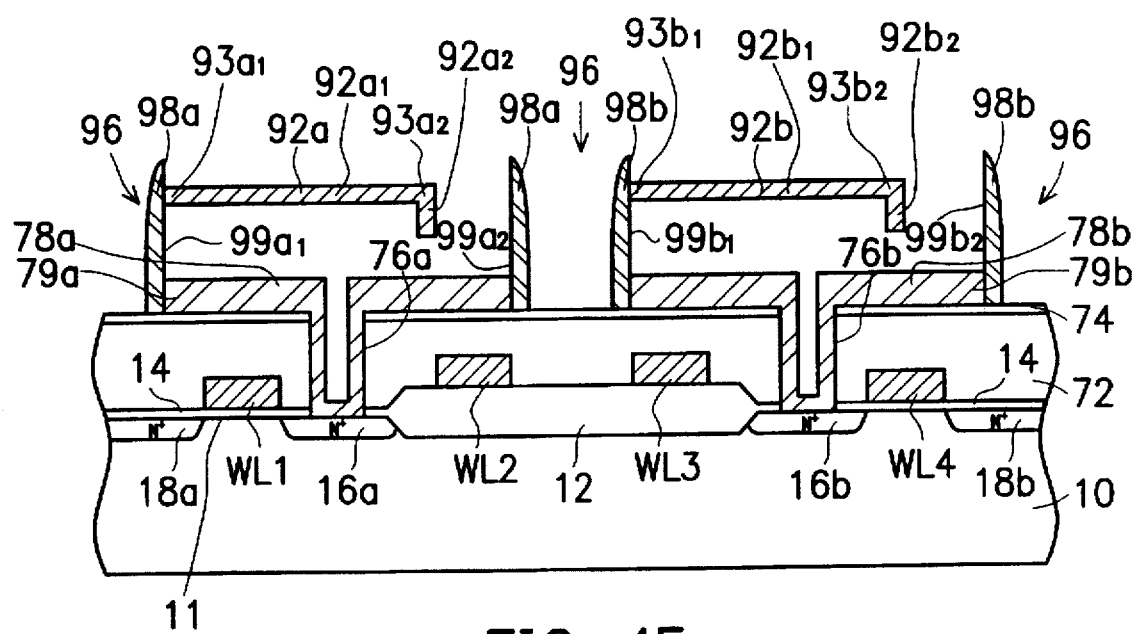

Referring to FIG. 4E, hollow upper trunk-like polysilicon layers 98a, 98b are formed at the peripheries of the openings 96, by depositing a polysilicon layer with a thickness of about 10,000 Å and etching back. The polysilicon layers 98a has, in cross section, opposing inner surfaces 99a1, 99a2, and the polysilicon layer 98b has, in cross section, opposing inner surfaces 99b1 and 99b2. Ions, such as arsenic ions, are implanted into the polysilicon layers 98a, 98b to increase their conductivity. The silicon dioxide insulating layers 94 and 80 are removed by wet etching, using the etching protection layer 74 as an etch end point. Accordingly, the storage electrode of each storage capacitor for a DRAM is completed.

Each storage electrode includes one of the lower trunk-like polysilicon layers 78a, 78b, one of the upper trunk-like polysilicon layers 98a, 98b, and one of the branch-like polysilicon layers 92a, 92b, the branch-like layers 92a, 92b being L-shaped in cross-section. The trunk-like lower polysilicon layers 78a, 78b are respectively connected to the drain regions 16a, 16b, and have portions 78c with U-shaped cross sections. The bottom ends of the upper trunk-like polysilicon layers 98a, 98b are respectively connected to the outer edges 79a, 79b of the lower trunk-like polysilicon layers 78a, 78b and extend substantially vertically upwards. Outer edges 93a1, 93b1 of the respective branch-like polysilicon layers 92a, 92b are respectively connected to the inner surfaces 99a1, 99b1 of the upper trunk-like polysilicon layers 98a, 98b. Horizontally extending portions 92a1, 92b1 of the branch-like layers 92a, 92b respectively extends from the inner surfaces 99a1, 99b1 of the upper trunk-like layers 98a, 98b toward the respective opposing inner surfaces 99a2, 99b2 to inner branch ends 93a2, 93b2. Vertically extending layer portions 92a2, 92b2 of the branch-like layers 92a, 92b are respectively connected to the inner ends 93a2, 93b2 92b1 and extend toward the substrate. The further processes for forming a dielectric layer and opposing electrode are similar to the earlier described methods and are, therefore, not described in detail herein.

In this embodiment, the spacers 86a and 86b, and the layers 80 and 94 are made of silicon dioxide, and the layers 82 and 88 are made of silicon nitride. However, silicon nitride can also be used to form the spacers 86a and 86b and the layers 80 and 94, in which case the layers 82, 88 are made of silicon dioxide. Moreover, any insulating material can be utilized to form the spacers 86a and 86b and the layers 80 and 94, provided that the insulating material used to form the layers 82, 88 has high etching selectivity relative to the other insulating material.

Fourth Preferred Embodiment

The branch-like layers of the electrodes fabricated in accordance with the previously described embodiments all have L-shaped cross sections. However, the invention is not limited to this particular shape. The cross-sectional shape of the branch-like storage electrode layers can be varied. In the embodiment described below, the storage electrode has a branch-like polysilicon layer which is substantially straight in cross section. Moreover, according to the above described embodiments, bottom surfaces of the lower trunk-like polysilicon layers directly contact the etching protection layers. However, the invention is not so limited. In the embodiment described below, the storage electrode is spaced from the etching protection layer so as to increase the surface area.

This fourth embodiment is fabricated based on the structure shown in FIG. 2A, and by further processes illustrated in FIGS. 5A–5F. The same reference numerals are used to designate elements in FIG. 5A through FIG. 5F which are identical to those in FIG. 2A.

Figure 5A:
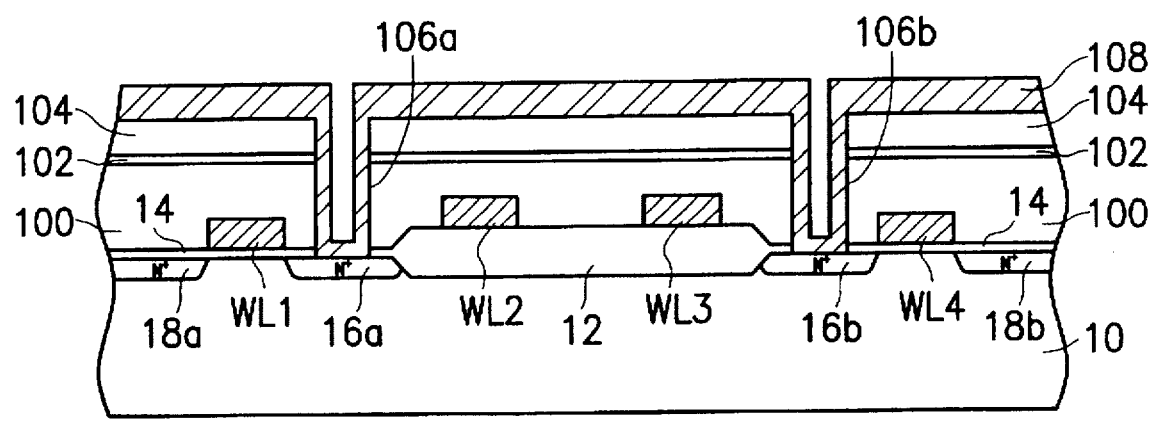
FIGS. 5A through 5F are cross-sectional views depicting a method of fabricating a semiconductor memory cell having a tree-type capacitor according to a fourth embodiment of invention.

Referring to FIG. 2A and FIG. 5A, an insulating layer 100 for planarization, an etching protection layer 102, and an insulating layer 104, are deposited in succession using CVD. The insulating layer 100 can be formed of BPSG, with a thickness of, for example, about 7000 Å. The etching protection layer 102 can be silicon nitride layer and have a thickness of, for example, about 1000 Å. The insulating layer 104 can be a silicon dioxide layer and have a thickness of, for example, about 1000 Å. Next, the insulating layer 104, the etching protection layer 102, the insulating layer 100, and the gate oxide layer 14 are etched in succession using a conventional photolithography and etching technique to form storage electrode contact holes 106a, 106b which expose the drain regions 16a, 16b. A polysilicon layer 108 is deposited to cover the upper surface of the insulating layer 104 and the sidewalls and bottom surfaces of the contact holes 106a, 106b, but so as not to completely fill the contact holes 106a, 106b. Therefore, the polysilicon layer 108 has a hollow structure, U-shaped in cross section. Ions, such as arsenic ions, can be implanted in the polysilicon layer 108 to increase its conductivity.

Figure 5B:
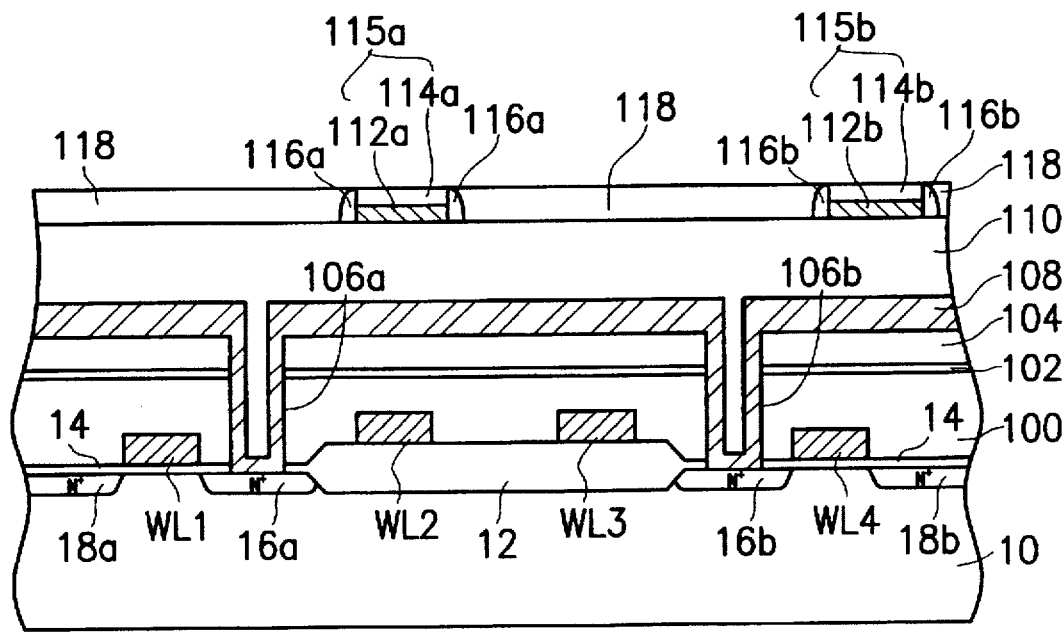

Referring to FIG. 5B, a thick silicon dioxide layer 110 having a thickness of, for example, about 7000 Å, is deposited on the polysilicon layer 108. Next, a silicon nitride layer, and then a sacrificial polysilicon layer, are deposited on the insulating layer 110, using CVD, and patterned to form silicon nitride layers 112a, 112b, and sacrificial polysilicon layers 114a, 114b as shown in FIG. 5B, using a conventional photolithography and etching technique. Each of the silicon nitride layers 112a, 112b has a thickness of, for example, about 1000 Å. The thickness of each of the sacrificial polysilicon layers 114a, 114b can be, for example, about 1000 Å. The silicon nitride layer 112a and the sacrificial polysilicon layer 114a together form a stacked layer 115a. The silicon nitride layer 112b and the sacrificial polysilicon layer 114b together form a stacked layer 115b. The stacked layers 115a, 115b are formed to be solid and their horizontal cross sections can, for example, be circular or rectangular, for example, or any other suitable shape. The stacked layers 115a, 115b are located on the silicon dioxide layers 110 respectively out of alignment with the drain regions 16a, 16b. That is, the stacked layers 115a, 115b are offset from the drain regions 16a, 16b. Also, the stacked layers 115a, 115b are preferably positioned to be offset above the same side of the respective drain regions 16a, 16b. In this preferred embodiment, the stacked layers 16a, 16b are both offset to the right side (in FIG. 5A) of the respective drain regions 16a, 16b. Silicon dioxide spacers 116a, 116b are respectively formed on the sidewalls of the stacked layers 115a, 115b, by depositing a silicon dioxide layer with a thickness of, for example, about 1000 Å, and etching back. A silicon nitride layer 118 having a thickness, for example, of about 2000 Å, is then deposited. Then, the silicon nitride layer 118 is polished, using a CMP technique, until the stacked layers 115a, 115b are exposed.

Figure 5C:
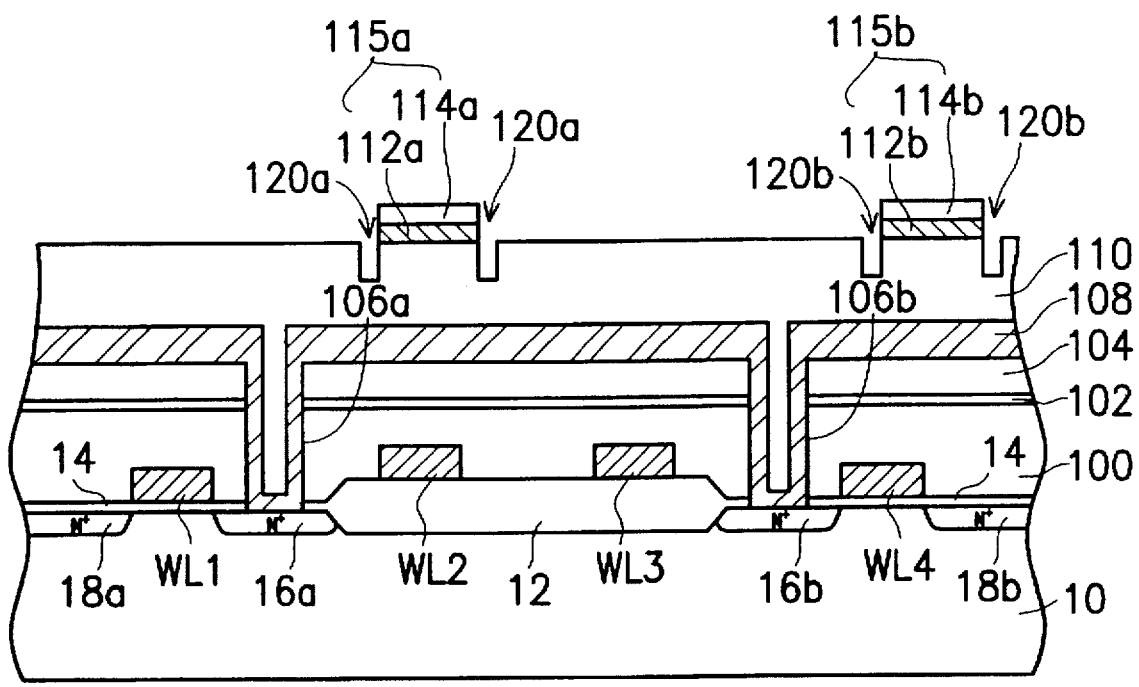

Referring to FIG. 5C, the silicon dioxide spacers 116a, 116b and the silicon dioxide layer 118 below are removed by etching, using the stacked layers 115a, 115b and the silicon nitride layer 118 as masks, to form openings 120a, 120b that do not reach the surface of the polysilicon layer 108 are formed. Then, the silicon nitride layer 118 is removed by etching, using the sacrificial polysilicon layers 114a, 114b as masks.

Figure 5D:
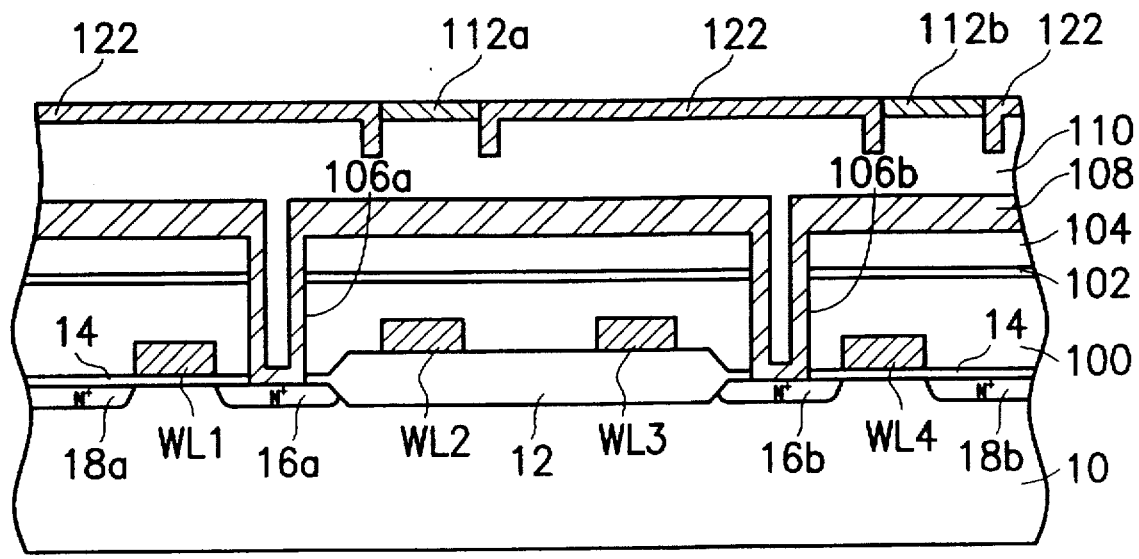

Referring to FIG. 5D, a polysilicon layer 122 having a thickness of, for example, 1000 Å, is deposited on the stacked layers 115a, 115b, and the silicon dioxide layer 110, so as to fill the openings 120a, 120b. Ions, such as arsenic ions, can be implanted in the polysilicon layer 122 to increase its conductivity. Then, the polysilicon layer 122 is polished, using a CMP technique, until the silicon nitride layers 112a, 112b are exposed. Accordingly, the sacrificial polysilicon layers 114a, 114b are removed.

Figure 5E:
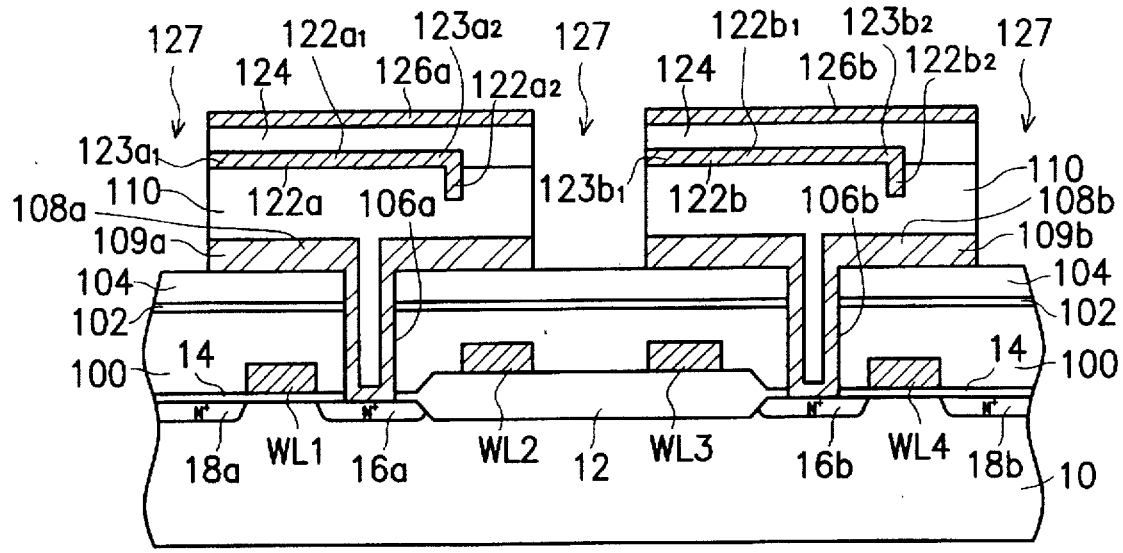

Referring to FIG. 5E, the silicon nitride layers 112a, 112b are removed by wet etching, using the polysilicon layer 122 and the silicon oxide layer 110 as masks. A silicon dioxide layer 124 having a thickness of, for example, about, 2000 Å is then deposited, using CVD. A polysilicon layer 126, having a thickness of, for example, about 1000 Å, is deposited on the silicon dioxide layer 124 using CVD. The polysilicon layer 126, the silicon dioxide layer 124, the polysilicon layer 122, the silicon dioxide layer 110, and the polysilicon layer 108 are etched in succession to form openings 127, on opposite sides of which the storage electrodes of the storage capacitors are to be formed. Accordingly, the polysilicon layers 122 and 108 are respectively segmented into branch-like layers 122a, 122b that are generally L-shaped in cross section, and lower trunk-like layers 108a, 108b that are generally T-shaped in cross section with a hollow U-shaped portion, respectively. The polysilicon layers 108a, 108b have respective outer edges 109a, 109b, and at their bottoms are connected to the respective source/drain regions 16a, 16b. The polysilicon layers 122a, 122b have respective horizontally extending portions 122a1, and 122b1, and respective vertically extending portions 122a2 and 122b2. The polysilicon layer 126 is segmented into horizontal layers 126a and 126b.

Figure 5F:
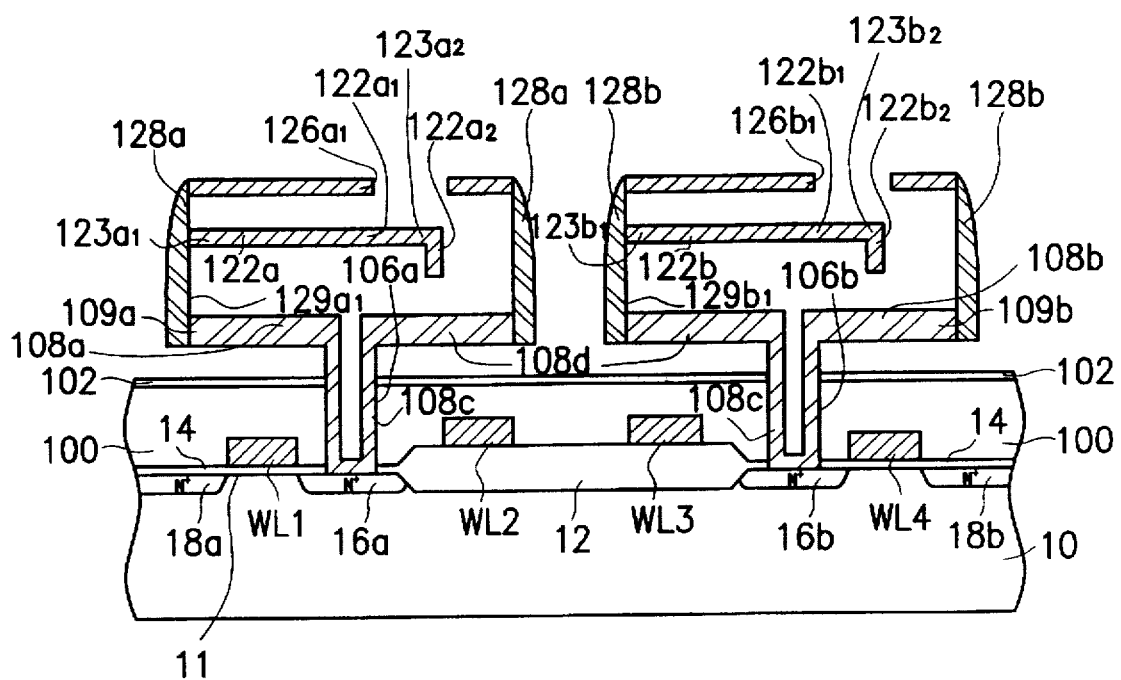

Referring to FIG. 5F, hollow, trunk-like polysilicon layers 128a, 128b are formed at peripheries of the openings 127, preferably by depositing a polysilicon layer with a thickness of, for example about, 10,000 Å, and etching back. The polysilicon layer 128a has, in cross section, opposing inner surfaces 129a1 and 129a2, and likewise, layer 128b has, in cross section, opposing inner surfaces 129b1 and 129b2. Ions, such as arsenic ions, can be implanted into the polysilicon layers 128a, 128b to increase their conductivity. The polysilicon layers 126a and 126b are then further etched to respectively form openings 126a1 and 126b1 therein, using a conventional photolithography and etching technique. The exposed silicon dioxide layers 124, 110, and 104 then are removed by wet etching, using the etching protection layer 102 as an etch end point.

Accordingly, the storage electrodes of the storage capacitors for a DRAM are completed, wherein each storage electrode includes one of the lower trunk-like polysilicon layers 108a, 108b, one of the upper trunk-like polysilicon layers 128a, 128b, one of the substantially horizontal branch-like layers 126a, 126b, and one of the L-shaped branch-like layers 122a, 122b, wherein the lower trunk-like polysilicon layers 108a, 108b are connected to the respective drain regions 16a, 16b, and have hollow base portions 108c that are U-shaped in cross section. The bottom ends of the upper trunk-like polysilicon layers 128a, 128b are respectively connected at their inner surfaces 129a1, 129a2 and 129b1, 129b2 to the outer edges 109a, 109b of support portion 108d of the lower trunk-like polysilicon layers 108a, 108b, and extend substantially vertically upward. The branch-like polysilicon layers 126a and 126b are respectively connected to inner surfaces 129a1, 129a2 and 129b1, 129b2 of the trunk-like upper polysilicon layers 128a and 128b, and extend substantially horizontally inward. The branch-like polysilicon layer 122a is L-shaped in cross section, and has a horizontally extending portion 122a1 which is connected to the inner surface 129a1 of the upper trunk-like polysilicon layers 128a at the outer edge 123a1 and extends substantially horizontally in cross section toward the opposite inner surface 129a2. Similarly, the horizontally extending portion 122b1 of the L-shaped branch-like layer 122b is connected to the inner surface 129b1 at the outer edge 123b1 and extends substantially horizontally in cross section toward the opposite inner surface 129b2. Vertically extending portions 122a2, 122b2 of the layers 122a and 122b are connected to the respective ends 123a2, 123b2 of the respective horizontally extending portions 122a1, 122b1, and extend towards to the top surface 11 of the substrate. Further processes to complete a storage capacitor of a DRAM are similar to the previous described processes, and they are not further described herein.

In this preferred embodiment, the spacers 116a and 116b and the layers 110 and 124 are made of silicon dioxide, and the layers 112 and 118 are made of silicon nitride. However, silicon nitride can also be used to form the spacers 116a and 116b and the layers 110 and 124, in which case the layers 112, 118 are made of silicon dioxide. Moreover any insulating material can be utilized to form the spacers 116a and 116b and the layers 110 and 124, provided that the insulating material used to form the layers 112 and 118 has high etching selectivity relative to the other insulating material.

Persons skilled in this art will recognize and the inventors contemplate, that the features of each of the embodiments can be applied in combination to obtain various storage electrodes that are within the scope of the invention.

Moreover, although the drain regions of the disclosed embodiments are described as diffusion structures, it is well known that other structures, such as trench structures, can also be used for the drain regions. Accordingly, the invention is not limited to the use of the described drain regions.

The shape, size, and extension angle of each element in the drawings are representative only. However, of course, various practical shapes, sizes, and angle of extension of each element in accordance with the invention are not limited by the representative ones.

While the invention has been described by way of example and in terms of preferred embodiments, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a storage electrode of a storage capacitor for use with a semiconductor memory device that includes a substrate and a transfer transistor having a source/drain region formed on the substrate, the method comprising the steps of:

a. forming a first conductive layer connected to the source/drain region;

b. forming a first insulating layer over the first conductive layer;

c. forming a first film on a portion of the first insulating layer and a second film on the first film, wherein the first film and the second film form a stacked layer, the stacked layer having a sidewall;

e. forming a second insulating layer on the sidewall of the stacked layer;

f. forming a third insulating layer over the substrate;

g. removing the second insulating layer and a portion of the first insulating layer therebeneath to form a first opening in the first insulating layer without exposing the first conductive layer;

h. removing the fourth insulating layer and the second film;

i. forming a second conductive layer over the substrate and so as to substantially fill the first opening;

j. removing the first film and a portion of the second conductive layer thereon;

k. forming a second opening in the first and second conductive layers and the first insulating layer; and l. forming a third conductive layer at a periphery of the opening, in connection with peripheral edges of the first and second conductive layers, wherein the storage electrode includes the first, second and third conductive layers.

2. A method as claimed in claim 1, further comprising the steps of removing the first insulating layer after said step l; forming a dielectric layer on exposed surfaces of the first, second, and third conductive layers; and
forming a fourth conductive layer on the dielectric layer, wherein the fourth conductive layer is an opposing electrode of the storage capacitor.

3. A method as claimed in claim 1, wherein the first conductive layer is T-shaped in cross section and has a peripheral edge, and the third conductive layer extends from the peripheral edge of the first conductive layer in a direction away from the substrate.

4. A method as claimed in claim 3, wherein the first conductive layer has a hollow base portion and a support portion on said base portion.

5. A method as claimed in claim 4, wherein said step a further includes the steps of forming a further insulating layer over the substrate and the transistor, forming a contact hole in the further insulating layer to expose the source/drain region, and forming the first conductive layer over the further insulating layer and in the first contact hole only along bottom and side surfaces thereof.

6. A method as claimed in claim 1, wherein the first film is made of an insulating material and the second film is made of a conductive material.

7. A method as claimed in claim 1, wherein the method further comprises the steps of:

forming a fifth insulating layer between said steps j and k, and then forming a fifth conductive layer, further including the step of patterning the fifth conductive layer, said step l including forming the third conductive layer in connection with a peripheral edge of the fifth conductive layer, and removing a portion of the fifth conductive layer after said step l, to expose the fifth insulating layer, the storage electrode including the fifth conductive layer having the portion removed.

8. A method as claimed in claim 7, wherein the fifth conductive layer is straight in cross section.

9. A method as claimed in claim 1, further comprising the steps of forming a further insulating layer over the substrate and the transistor, and forming an etching protection layer over the further insulating layer, before said step a, said step a includes forming the first conductive layer to penetrate the etching protection layer and the further insulating layer.

10. A method as claimed in claim 9, wherein the first film is made of an insulating material and the second film is made of a conductive material.

11. A method as claimed in claim 9, wherein the method further comprises the steps of:

forming a fifth insulating layer between said steps j and k, and then forming a fifth conductive layer, further including a step of patterning the fifth conductive layer, and removing a portion of the fifth conductive layer after said step l, to expose the fifth insulating layer, the storage electrode including the fifth conductive layer having the portion removed.

12. A method as claimed in claim 11, wherein the fifth conductive layer is straight in cross section and connected to the third conductive layer.

13. A method as claimed in claim 1, further comprising the steps of repeating said steps b through j before said step k to form a fourth conductive layer that extends substantially in parallel with the second conductive layer, wherein the third conductive layer is formed in said step l so as to contact a peripheral edge of the fourth conductive layer, wherein the storage electrode includes the fourth conductive layer.

14. A method as claimed in claim 13, wherein the third conductive layer extends in a direction away from the substrate.

15. A method as claimed in claim 14, wherein the first conductive layer is T-shaped in cross section.

16. A method as claimed in claim 15, wherein the first conductive layer has a hollow base portion and a support portion above the base portion.

17. A method as claimed in claim 16, wherein said step a further includes the steps of forming a further insulating layer over the substrate and the transistor, forming a contact hole in the further insulating layer to expose the source/drain region, and forming the first conductive layer over the further insulating layer and in the first contact hole only along bottom and side surfaces thereof.

18. A method as claimed in claim 13, wherein in each step c, the first film is made of an insulating material and the second film is made of a conductive material.

19. A method as claimed in claim 13, wherein the method further comprises the steps of:

forming a fifth insulating layer between said steps j and k, and then forming a fifth conductive layer, further including a step of patterning the fifth conductive layer, and removing a portion of the fifth conductive layer after said step l, to expose the fifth insulating layer, the storage electrode including the fifth conductive layer having the portion removed.

20. A method as claimed in claim 19, wherein the fifth conductive layer is straight in cross section.

21. A method as claimed in claim 1, wherein said step a further comprises the steps of forming a further insulating layer over the substrate and the transistor and forming an etching protection layer over the further insulating layer, and then forming a sixth insulating layer over the etching protection layer, and forming the first conductive layer so as to penetrate the sixth insulating layer, the etching protection layer, and the further insulating layer, said step l further comprising the step of removing the sixth insulating layer.

22. A method as claimed in claim 21, wherein the third conductive layer extends in a direction away from the substrate.

23. A method as claimed in claim 21, wherein the method further comprises the steps of:

forming a fifth insulating layer between said steps j and k, and then forming a fifth conductive layer, further including a step of patterning the fifth conductive layer, and removing a portion of the fifth conductive layer after said step l, to expose the fifth insulating layer, the storage electrode including the fifth conductive layer having the portion removed.

24. A method as claimed in claim 23, wherein the fifth conductive layer is straight in cross section and connected to the third conductive layer.

25. A method as claimed in claim 21, further comprising the steps of repeating said steps b through j before said step k to form a fourth conductive layer that extends substantially in parallel with the second conductive layer, wherein the third conductive layer is formed in said step l so as to contact a peripheral edge of the fourth conductive layer, wherein the storage electrode includes the fourth conductive layer.

* * * * *